United States Patent
Tsai et al.

(10) Patent No.: US 10,797,025 B2
(45) Date of Patent: Oct. 6, 2020

(54) ADVANCED INFO POP AND METHOD OF FORMING THEREOF

(71) Applicant: Taiwan Semiconductor Manufacturing Company, Ltd., Hsin-Chu (TW)

(72) Inventors: Yi-Da Tsai, Donshi Township (TW); Meng-Tse Chen, Changzhi Township (TW); Sheng-Feng Weng, Taichung (TW); Sheng-Hsiang Chiu, Tainan (TW); Wei-Hung Lin, Xinfeng Township (TW); Ming-Da Cheng, Jhubei (TW); Ching-Hua Hsieh, Hsin-Chu (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 639 days.

(21) Appl. No.: 15/157,192

(22) Filed: May 17, 2016

(65) Prior Publication Data

US 2017/0338202 A1    Nov. 23, 2017

(51) Int. Cl.
*H01L 23/31* (2006.01)
*H01L 21/56* (2006.01)
(Continued)

(52) U.S. Cl.
CPC ........ *H01L 25/0657* (2013.01); *H01L 21/563* (2013.01); *H01L 21/565* (2013.01); *H01L 21/6835* (2013.01); *H01L 21/6836* (2013.01); *H01L 21/78* (2013.01); *H01L 23/3107* (2013.01); *H01L 23/481* (2013.01); *H01L 24/17* (2013.01); *H01L 24/19* (2013.01); *H01L 24/20* (2013.01); *H01L 24/97* (2013.01); *H01L 25/105* (2013.01); *H01L 25/50* (2013.01); *H01L 21/568* (2013.01); *H01L 23/3128* (2013.01); *H01L 2221/68327* (2013.01); *H01L 2221/68354* (2013.01); *H01L 2221/68368* (2013.01);
(Continued)

(58) Field of Classification Search
CPC ..... H01L 2924/181; H01L 2224/32145; H01L 21/565; B29C 43/18
See application file for complete search history.

(56) References Cited

U.S. PATENT DOCUMENTS 6,468,381 B1 * 10/2002 Morgan ............. A63B 37/0003
156/244.19
8,012,799 B1 * 9/2011 Ibrahim ................ H01L 21/566
438/107
(Continued)

*Primary Examiner* — Bradley Smith
*Assistant Examiner* — David J Goodwin
(74) *Attorney, Agent, or Firm* — Slater Matsil, LLP

(57) ABSTRACT

In accordance with some embodiments, a package-on-package (PoP) structure includes a first semiconductor package having a first side and a second side opposing the first side, a second semiconductor package having a first side and a second side opposing the first side, and a plurality of inter-package connector coupled between the first side of the first semiconductor package and the first side of the second semiconductor package. The PoP structure further includes a first molding material on the second side of the first semiconductor package. The second side of the second semiconductor package is substantially free of the first molding material.

20 Claims, 19 Drawing Sheets

(51) Int. Cl.
  *H01L 25/065*   (2006.01)
  *H01L 23/00*    (2006.01)
  *H01L 25/10*    (2006.01)
  *H01L 21/683*   (2006.01)
  *H01L 21/78*    (2006.01)
  *H01L 23/48*    (2006.01)
  *H01L 25/00*    (2006.01)

(52) U.S. Cl.
  CPC .............. *H01L 2224/024* (2013.01); *H01L 2224/0237* (2013.01); *H01L 2224/04105* (2013.01); *H01L 2224/12105* (2013.01); *H01L 2224/13022* (2013.01); *H01L 2224/13024* (2013.01); *H01L 2224/16145* (2013.01); *H01L 2224/81815* (2013.01); *H01L 2225/06513* (2013.01); *H01L 2225/06548* (2013.01); *H01L 2225/1035* (2013.01); *H01L 2225/1058* (2013.01); *H01L 2924/06* (2013.01); *H01L 2924/0635* (2013.01); *H01L 2924/0665* (2013.01); *H01L 2924/0715* (2013.01); *H01L 2924/07025* (2013.01); *H01L 2924/14* (2013.01); *H01L 2924/18162* (2013.01); *H01L 2924/19011* (2013.01); *H01L 2924/19102* (2013.01); *H01L 2924/3511* (2013.01)

(56) References Cited

U.S. PATENT DOCUMENTS

| | | | |
|---|---|---|---|
| 8,361,842 B2 | 1/2013 | Yu et al. | |
| 8,647,924 B2* | 2/2014 | Toh | H01L 21/561 438/109 |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 2007/0152314 A1* | 7/2007 | Manepalli | H01L 24/83 257/686 |
| 2010/0308474 A1* | 12/2010 | Shibuya | H01L 21/486 257/778 |
| 2011/0291288 A1 | 12/2011 | Wu et al. | |
| 2012/0018920 A1* | 1/2012 | Ogiso | B29C 31/041 264/272.14 |
| 2012/0040500 A1* | 2/2012 | Lin | H01L 21/561 438/127 |
| 2012/0147578 A1* | 6/2012 | Jin | H01F 19/04 361/774 |
| 2012/0175761 A1* | 7/2012 | Zenbutsu | H01L 24/45 257/676 |
| 2012/0187598 A1* | 7/2012 | Lee | H01L 24/97 264/272.15 |
| 2012/0299181 A1* | 11/2012 | Chen | H01L 21/565 257/738 |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0307140 A1 | 11/2013 | Huang et al. | |
| 2014/0008785 A1* | 1/2014 | Lin | H01L 24/73 257/737 |
| 2014/0073087 A1* | 3/2014 | Huang | H01L 25/50 438/107 |
| 2014/0191419 A1* | 7/2014 | Mallik | H01L 25/0652 257/777 |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2015/0311095 A1* | 10/2015 | Okada | C25D 1/00 257/673 |
| 2018/0138150 A1* | 5/2018 | Eom | H01L 25/0657 |
| 2018/0337163 A1* | 11/2018 | Yu | H01L 25/50 |

\* cited by examiner

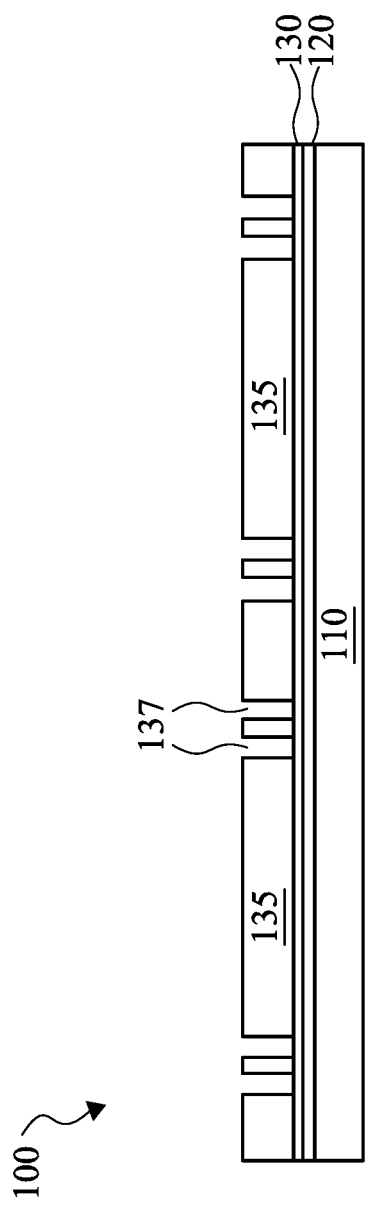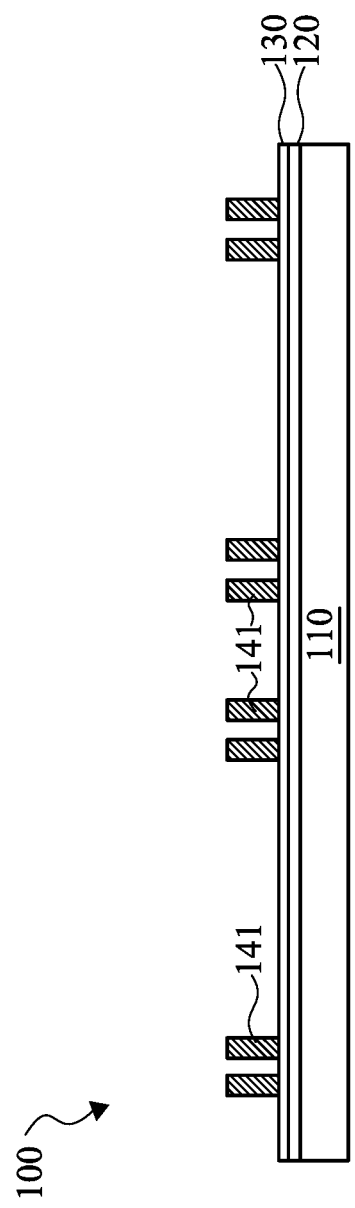

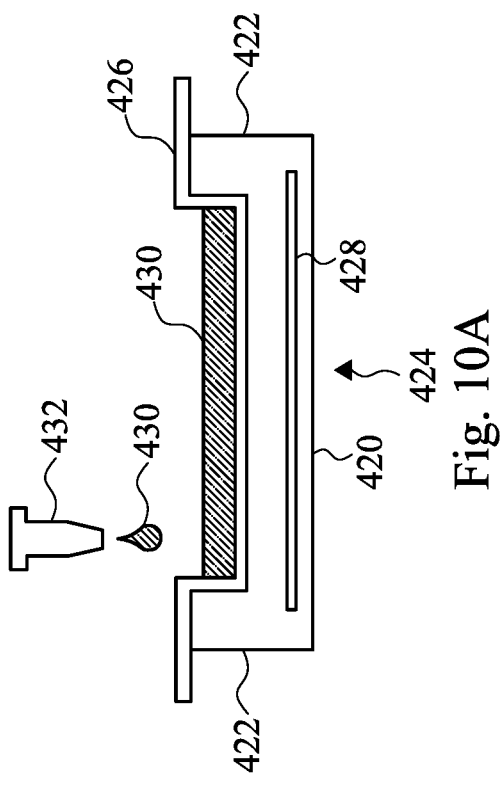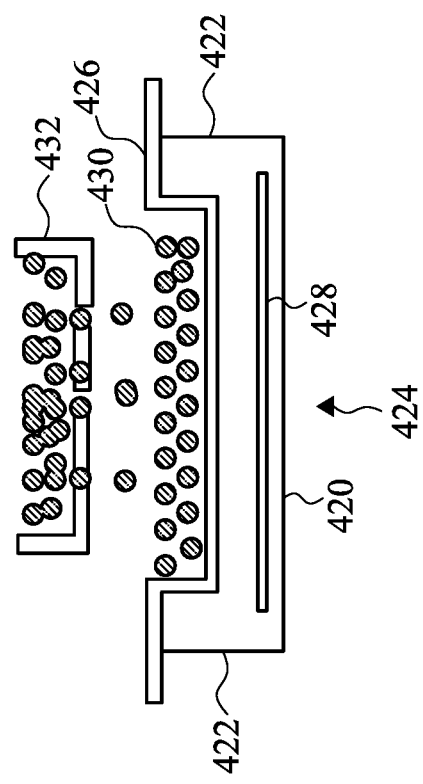
Fig. 10A
Fig. 10B

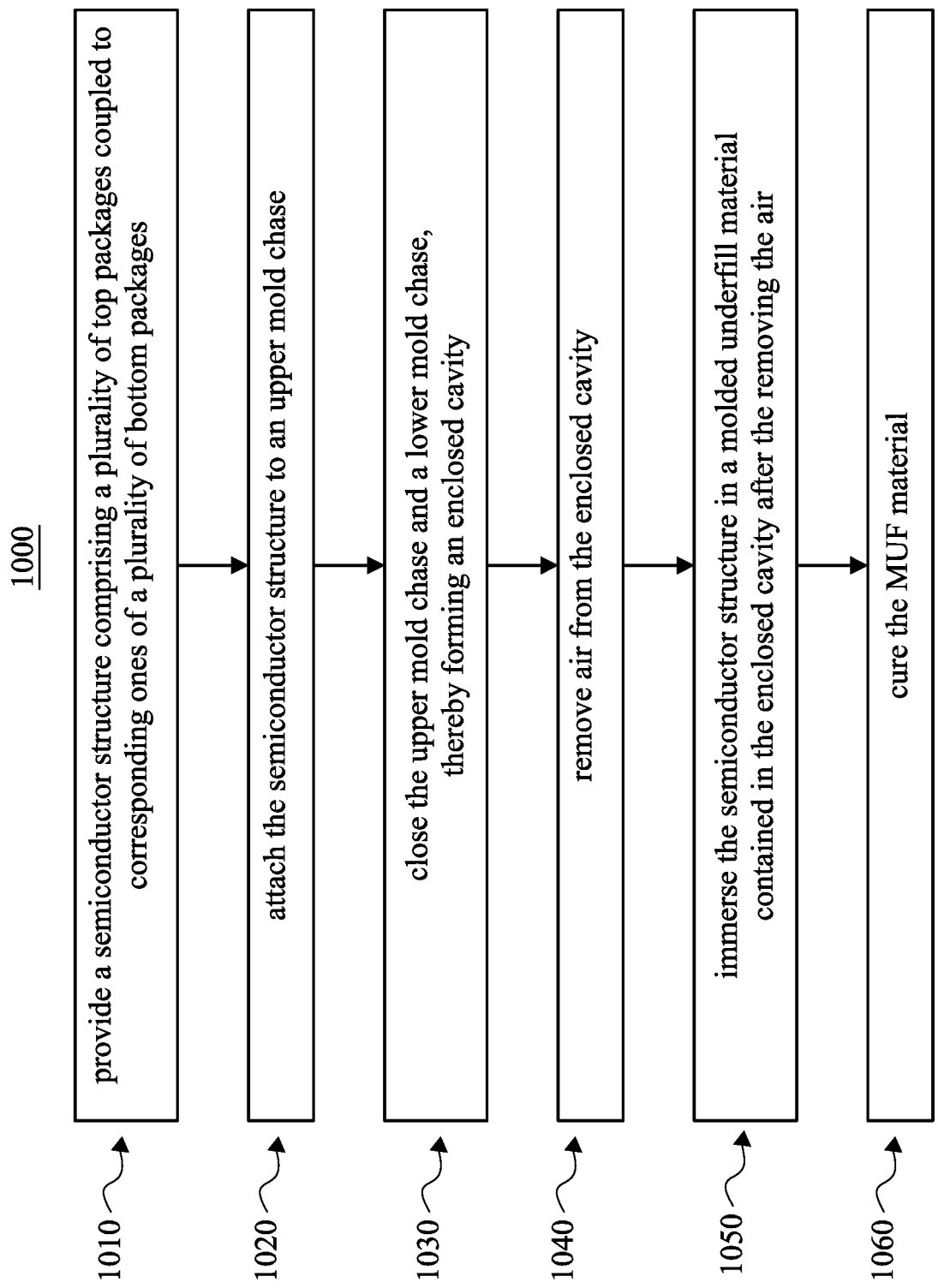

ADVANCED INFO POP AND METHOD OF FORMING THEREOF

TECHNICAL FIELD

The present invention relates generally to semiconductor packaging, and, in particular embodiments, to an integrated fan-out (INFO) package-on-package (PoP) and method for forming the PoP package using molded underfill (MUF) material.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

An example of these packaging technologies is the Package-on-Package (POP) technology. In a PoP package, a top semiconductor packages is stacked on top of a bottom semiconductor package to allow high level of integration and component density. This high level of integration from PoP technology enables production of semiconductor devices with enhanced functionalities and small footprints on the printed circuit board (PCB). A semiconductor package with a small footprint on PCB is advantageous for small form factor devices such as mobile phones, tablets and digital music players. Another advantage of a PoP package is that it minimizes the length of the conductive paths connecting the interoperating parts within the package. This improves the electrical performance of the semiconductor device, since shorter routing of interconnections between circuits yields faster signal propagation and reduced noise and cross-talk.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1-13 and 14A-14F illustrate cross-sectional views of a semiconductor structure at various manufacturing stages, in accordance with some embodiments; and FIG. 15 illustrates a flow chart of a method of forming semiconductor packages in various embodiments.

DETAILED DESCRIPTION OF ILLUSTRATIVE EMBODIMENTS

Figure 3:
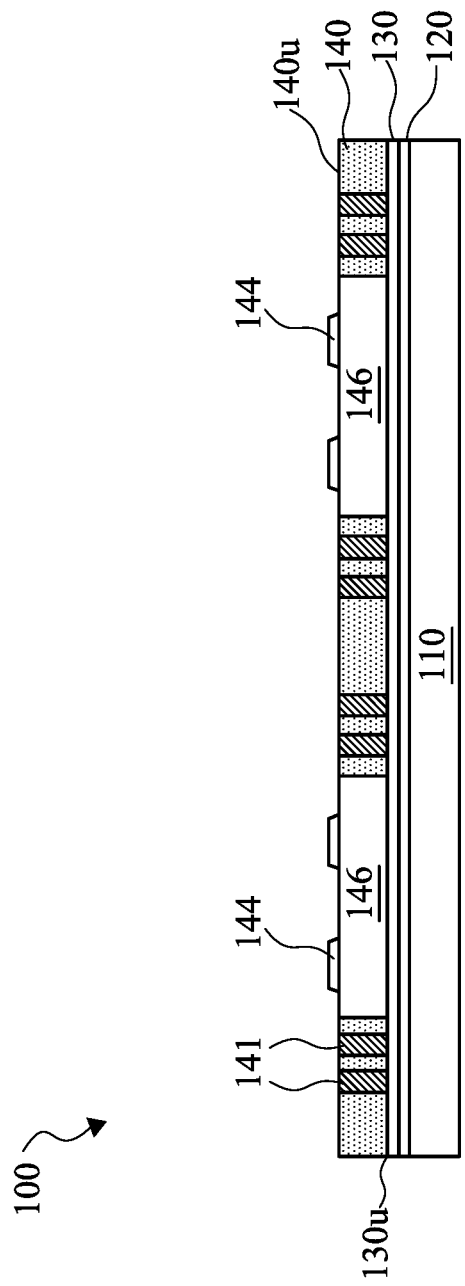

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated fan-out (INFO) package-on-package (PoP) and methods of forming the same are provided in accordance with various embodiments. In particular, PoP packages are formed by forming a semiconductor structure comprising top packages coupled to corresponding bottom packages, submerging the semiconductor structure in a molding material in a vacuum environment while the molding material is compressed into gaps of the semiconductor structure, and dicing the semiconductor structure to form a plurality of PoP packages. Intermediate stages of forming the PoP packages are illustrated. One of ordinary skill in the art will readily understand other modifications that may be made that are contemplated within the scope of other embodiments. Although method embodiments are discussed in a particular order, various other method embodiments may be performed in any logical order and may include fewer or more steps described herein.

FIGS. 1-14 illustrates cross-sectional views of a semiconductor structure at various manufacturing stages, in accordance with some embodiments.

FIG. 1 illustrates a cross-sectional view of a semiconductor structure 100 formed on a carrier 110. As shown in FIG. 1, an adhesive layer 120 and a back-side dielectric layer 130 are formed successively over carrier 110. Carrier 110 supports semiconductor structure 100 formed thereon, and may be made of a material such as silicon, polymer, polymer composite, metal foil, ceramic, glass, glass epoxy, beryllium oxide, tape, or other suitable material for structural support. In some embodiments, carrier 150 is made of glass. Adhesive layer 120 is deposited or laminated over carrier 110, in some embodiments. Adhesive layer 120 may be photosensitive, and could be easily detached from carrier 110 by shining, e.g., an ultra-violet (UV) light on carrier 110 in a subsequent carrier de-bonding process. For example, adhesive layer 120 may be a light-to-heat-conversion (LTHC) coating made by 3M Company of St. Paul, Minn. In other embodiments, adhesive layer 120 may be omitted.

Back-side dielectric layer 130 may function as a buffer layer, and may be made of polymers, such as polyimide (PI), polybenzoxazole (PBO), or benzocyclobutene, in some embodiments, or silicon dioxide, silicon nitride, silicon oxynitride, tantalum pentoxide, or aluminum oxide, in some other embodiments. Any suitable methods known in the art, such as physical vapor deposition (PVD), chemical vapor deposition (CVD), printing, spin coating, spray coating, sintering, or thermal oxidation, may be used to form back-side dielectric layer 130. Back-side dielectric layer 130 is shown as one layer in FIG. 1, however, skilled artisans will appreciate that back-side dielectric layer 130 may include a plurality of dielectric layers.

As shown in FIG. 1, a sacrificial material 135 is formed over back-side dielectric layer 130. Sacrificial material 135 may comprise a photoresist, an organic material, an insulating material, or other materials, as examples, and may be formed by PVD, CVD, spin coating, or other suitable deposition techniques. Sacrificial material 135 is patterned with desired patterns 137 or openings 137 for forming vias 141 (see FIG. 2) using, e.g., a lithography process or a direct patterning process, as shown in FIG. 1. In a lithography process, sacrificial material 135 is exposed to light or energy reflected from or transmitted through a lithography mask (not shown) that has the desired pattern thereon. The sacrificial material 135 is then developed, and portions of the sacrificial material 135 are then ashed or etched away. A direct patterning process may comprise forming patterns 137 in sacrificial material 135 using a laser, for example. Alternatively, the sacrificial material 135 may be patterned using other methods.

Next, as illustrated in FIG. 2, openings 137 in sacrificial material 135 are filled with electrically conductive material to form conductive features 141. The conductive material may comprise copper (Cu), although other suitable conductive materials may also be used. In some embodiments, a plating process is used to form a conductive material in openings 137 of sacrificial material 135. A seed layer (not shown) may be formed before the plating process. The plating process may comprise an electro-chemical plating (ECP), electroless plating, or other types of plating processes, for example. After the plating process, sacrificial material 135 is stripped or removed, and conductive features 141 are formed over back-side dielectric layer 130, as shown in FIG. 2. Conductive features 141 become vias 141 after being surrounded by a molding material in a subsequent processing step, in various embodiments.

In other embodiments, conductive features 141 may be formed using subtractive techniques, damascene techniques, or other methods. For example, in a subtractive technique, a conductive material such as Cu, a Cu alloy, other metals, or combinations or multiple layers thereof may be formed over the surface of back-side dielectric layer 130, and the conductive material is then patterned to form the conductive features 141. The conductive material may be patterned using photolithography, by forming a layer of photoresist over the conductive material, exposing the layer of photoresist to light or energy reflected from or transmitted through a lithography mask having a desired pattern thereon, and developing the layer of photoresist. Exposed (or unexposed, depending on whether the layer of photoresist is positive or negative) portions of the layer of photoresist are then ashed and removed. The patterned layer of photoresist is then used as an etch mask during an etch process for the conductive material. The layer of photoresist is removed, leaving the conductive material patterned with the desired pattern of conductive features 141.

Referring to FIG. 3, a plurality of semiconductor devices 146 are attached to an upper surface 130U of back-side dielectric layer 130 between conductive features 141. Semiconductor devices 146 may be or comprise a die, a semiconductor chip, or an integrated circuit (IC), as examples. In the discussion hereinafter, semiconductor devices 146 may also be referred to as dies 146. A glue layer or a die attaching film (DAF) (not shown) may be used between dies 146 and back-side dielectric layer 130 for attaching dies 146. As shown in FIG. 3, dies 146 are attached to back-side dielectric layers 130 with the front side (e.g., the side with contact pads 144 formed thereon, which contact pads 144 are electrically connected to the internal circuit of die 146) of each die 146 facing away from carrier 110, in accordance with an embodiment of the present disclosure.

Still referring to FIG. 3, after dies 146 are attached, a molding compound 140 is disposed around dies 146, thereby forming a molding layer 140. For example, in a top down view of molding compound 140/dies 146 (not illustrated), molding compound 140 may encircle dies 146. Molding compound 140 may provide suitable surfaces for forming fan-out redistribution layers (RDLs), such as RDLs 150, 160 and 170 (see FIG. 4). Molding compound 140 may include any suitable material such as an epoxy resin, a molding underfill, and the like. Suitable methods for forming molding compound 140 may include compressive molding, transfer molding, liquid encapsulent molding, and the like. Conductive features 141 become vias 141, e.g., through-inter vias (TIVs) 141, after being surrounded by molding layer 140. In other embodiments, TIVs 141 may be formed after molding layer 140 is formed over back-side dielectric layer 130. For example, vias 141 may be formed by etching molding layer 140 to form a plurality of via holes first, then filling the via holes with conductive material to form vias.

Still referring to FIG. 3, after molding layer 140 is formed, a planarization process may be implemented using suitable techniques such as grinding, polishing and/or chemical etching, a combination of etching and grinding techniques to generate a planar upper surface 140U for molding layer 140. A chemical-mechanical polishing (CMP) process may be used to produce a planar upper surface 140U for molding layer 140, in some embodiments. In FIG. 3, upper surfaces of contact pads 144 are shown to be higher (e.g., rise above) planar upper surface 140U of molding layer 140. In other embodiments (not illustrated), upper surfaces of contact pads 144 may be flush with upper surface 140U of molding layer 140.

Figure 4:
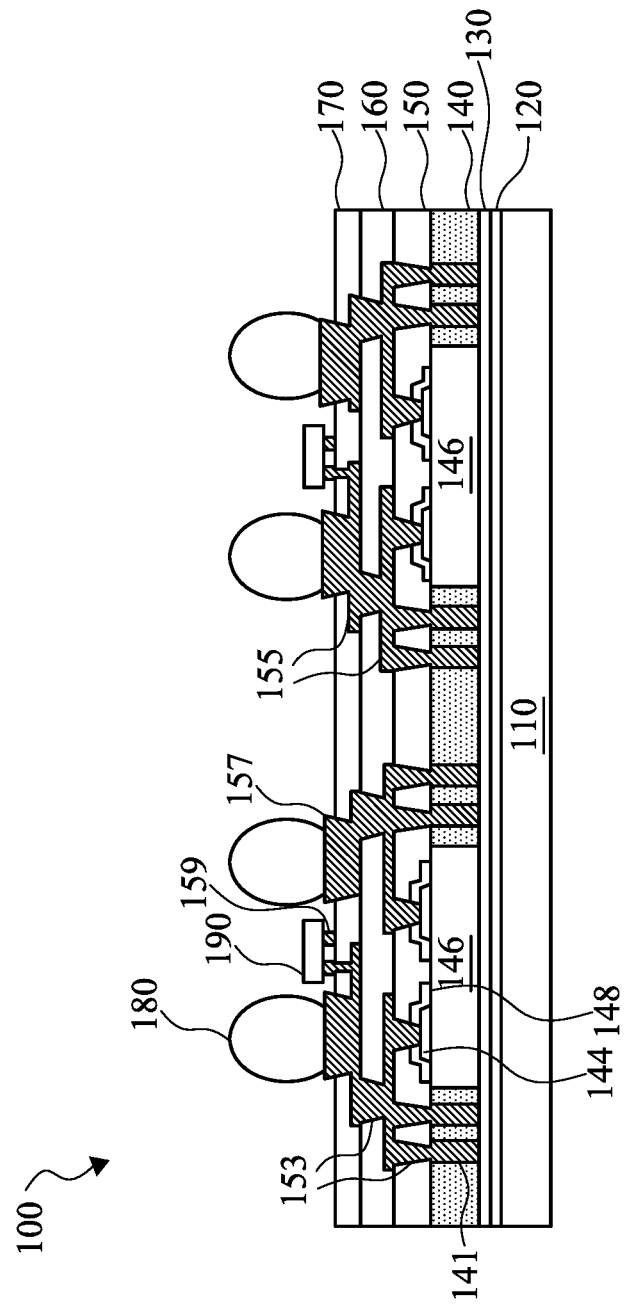

Referring to FIG. 4, a passivation layer 148 is formed over molding layer 140 and dies 146. Passivation layer 148 may comprise PI, PBO or other suitable materials, and may be formed using spin-on techniques, PVD, CVD, or any other suitable formation methods. After passivation layer 148 is formed, photolithography and etching process may be performed to form openings in passivation layer 148 to expose at least center portions of contact pads 144, such that contact pads 144 could be connected to interconnect structures in RDLs formed in subsequent processing.

Still referring to FIG. 4, one or more RDLs, e.g., RDL 150, 160, and 170, may be formed over dies 146, passivation layer 148, and molding layer 140. RDLs 150, 160 and 170 may extend laterally beyond edges of dies 146 to provide fan-out interconnect structures. Each of RDLs 150, 160, and 170 may include one or more polymer layers formed over upper surfaces of dies 146 and molding layer 140. In some embodiments, the polymer layers may comprise PI, PBO, benzocyclobuten (BCB), epoxy, silicone, acrylates, nano-filled pheno resin, siloxane, a fluorinated polymer, polynorbornene, and the like formed using any suitable means such as spin-on techniques, as an example. Conductive features (e.g., electrically conductive lines 155 and/or vias 153) are formed within the polymer layers. As shown in FIG. 4, conductive lines 155 and/or vias 153 may be electrically coupled to TIVs 141 and/or contact pads 144 of dies 146. Although three RDLs are shown in FIG. 4, skilled artisan will readily appreciate that more or less than three RDLs can also be used without departing from the spirit of the present disclosure.

Still referring to FIG. 4, external connectors 180 are formed over pads 157 that are electrically coupled to one or more RDLs (e.g., RDL 150, 160, and 170). External connectors may be solder balls, such as, ball grid array (BGA) balls, controlled collapse chip connector (C4) bumps, microbumps, and the like. In some embodiments, one or more integrated passive devices (IPDs) 190 are electrically coupled to micro-pads 159. Micro-pads 159 are electrically coupled to one or more RDLs (e.g., RDLs 150, 160, and 170), in various embodiments. A wide variety of passive devices, such as baluns, couplers, splitters, filters and diplexers can be integrated in IPD devices. IPD devices may replace traditional discrete surface mount devices (SMDs) for smaller footprint, cost reduction, and performance improvement.

Figure 5:
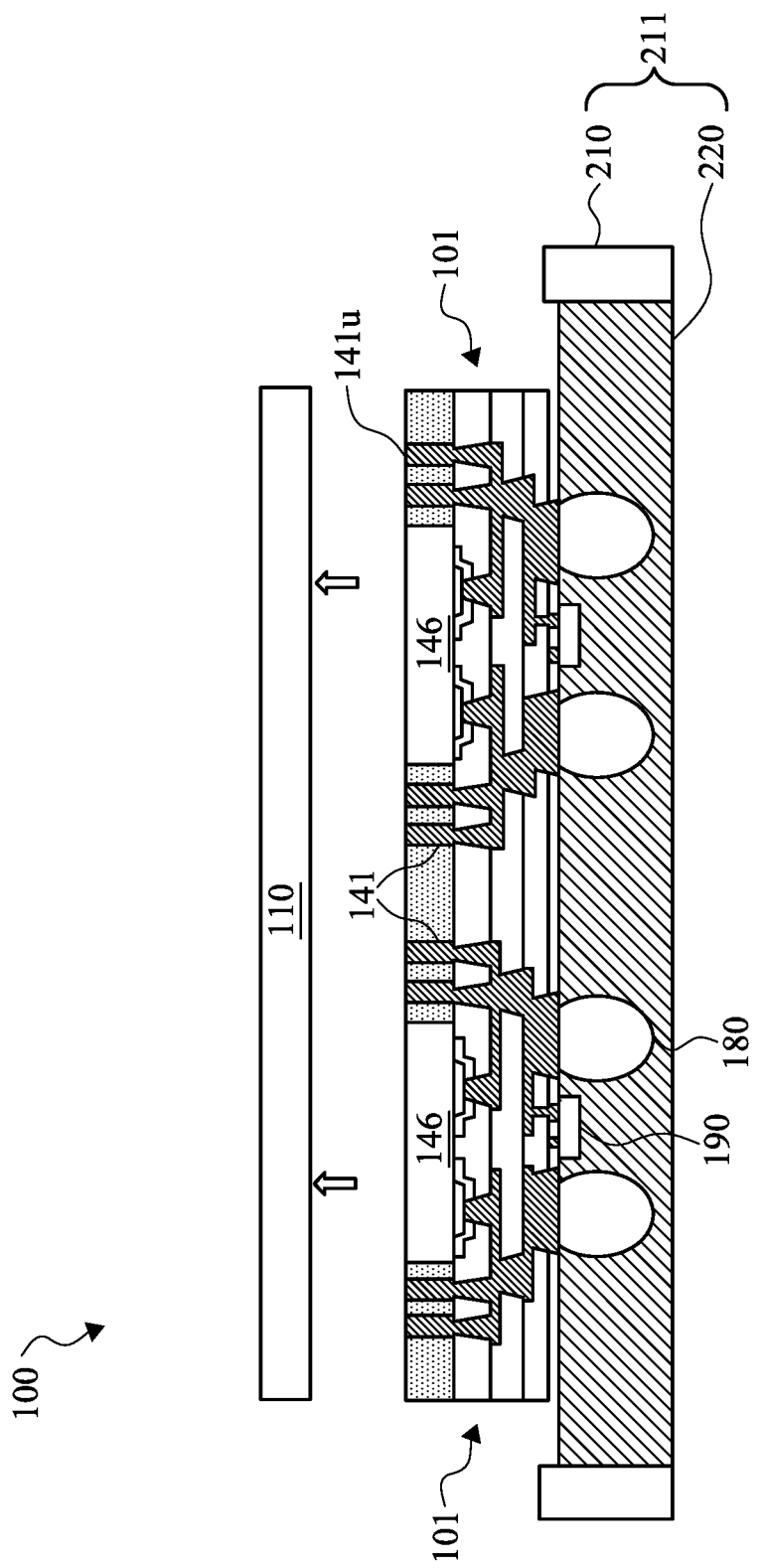

Next, as shown in FIG. 5 in cross-sectional view, structure 100 shown in FIG. 4 is flipped over and attached to a tape 220 supported by a frame 210, and subsequently, carrier 110 is de-bonded. Frame 210 and tape 220 are sometimes referred to a support 211. In accordance with some embodiments, tape 220 is a dicing tape, such as a dicing tape made by MINITRON Elektronik Gmbh of Germany. Tape 220 is soft and has a thickness larger than the height of external connectors 180, in some embodiments. In accordance with an embodiment of the present disclosure, semiconductor structure 100 is pressed onto tape 220 such that external connectors 180 are embedded in (e.g., pressed into) tape 220. As shown in FIG. 5, IPD devices 190 may also be embedded in tape 220.

Carrier 110 may be de-bonded by chemical wet etching, plasma dry etching, mechanical peel-off, CMP, mechanical grinding, thermal bake, laser scanning, or wet stripping, as examples. In some embodiments, carrier 110 is a glass carrier and is de-bonded by a laser de-bonding process. Ultraviolet light emitted by an excimer laser goes through the glass and is absorbed near the glass/adhesive interface. The ultraviolet light initiates a photochemical process that breaks the chemical bonds in the adhesive layer (not shown). As a result, glass carrier 110 can be easily separated from structure 100.

After carrier de-bonding, structure 100 contains a plurality of bottom packages 101. Two bottom packages 101 are shown in FIG. 5. However, tens of, hundreds of, or even more bottom packages 101 may be formed in structure 100. Although back-side dielectric layer 130 and adhesive layer 120 are shown as being removed in FIG. 5, residuals of layer 130 and/or layer 120 might exist. Therefore, to facilitate electrical connection with top packages 300 (see FIG. 6), laser drilling, etching, or other suitable techniques may be used to remove residuals of layer 130 and/or layer 120 to expose top surfaces 141U of TIVs 141, in accordance with some embodiments.

Figure 6:
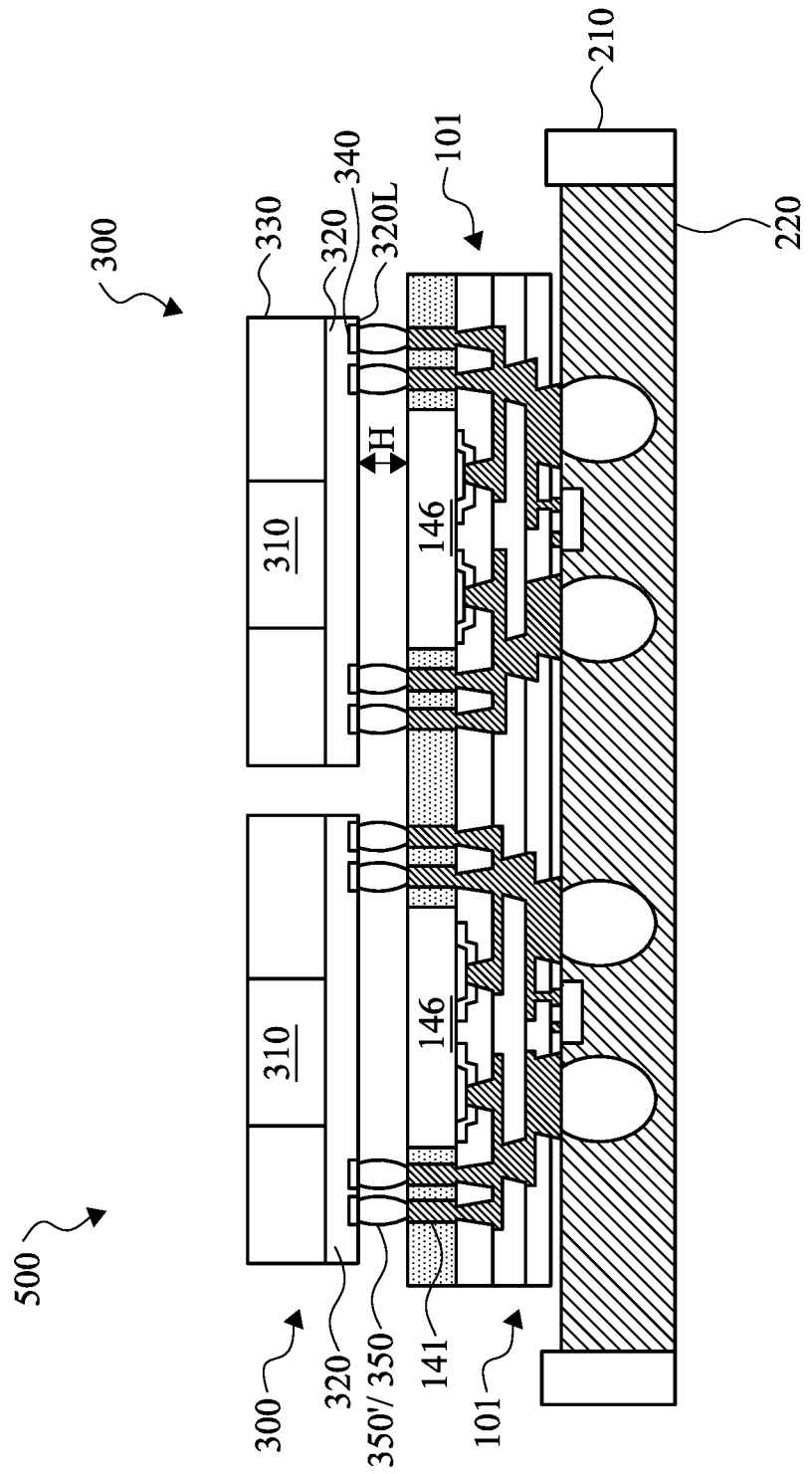

Next, as shown in FIG. 6, top packages 300 are stacked on top of bottom packages 101. Top packages 300 are aligned with corresponding bottom packages 101 so that locations of external connectors 350' of top packages 300 match those of top surfaces of TIVs 141. Each top package 300 may include a die 310 attached to a substrate 320, with molding compound 330 around dies 310. Substrate 320 may comprise RDLs. External connectors 350' are electrically coupled to dies 310 via contact pads 340 of top packages 300, in some embodiments. Although not shown in FIG. 6, contact pads 340 may be electrically coupled to conductive features in substrate 320 that connect contact pads 340 with dies 310.

After top packages 300 are stacked on bottom packages 101, a reflow process may be performed to form interpackage connector 350, in accordance with some embodiments. Inter-package connectors 350 may be copper pillars, C4 bumps, or other suitable types of connectors. Inter-package connectors 350 electrically couples bottom packages 101 with top packages 300. In some embodiments, prior to forming inter-package connectors 350, solder paste may be formed on exposed top surfaces 141U (see FIG. 5) of TIVs 141 using, e.g., a solder printing machine. In the subsequent reflow process, solder paste melts and merges with external connectors 350' of top packages 300 to form inter-package connectors 350, in some embodiments. In other embodiments, solder paste is not used. Instead, flux is applied on exposed top surfaces 141U (see FIG. 5) of TIVs 141, and a reflow process is performed to bond external connectors 350' of top packages 300 with TIVs 141, thereby forming inter-package connectors 350. In some embodiments, the gap between surface 320L of top packages 300 and surface 140L of bottom package 101 has a height H in a range between about 100 μm to about 400 μm. After the processing shown in FIG. 6, a semiconductor structure 500 that comprises a plurality of top packages coupled to corresponding bottom packages 101 is formed.

Figure 7:
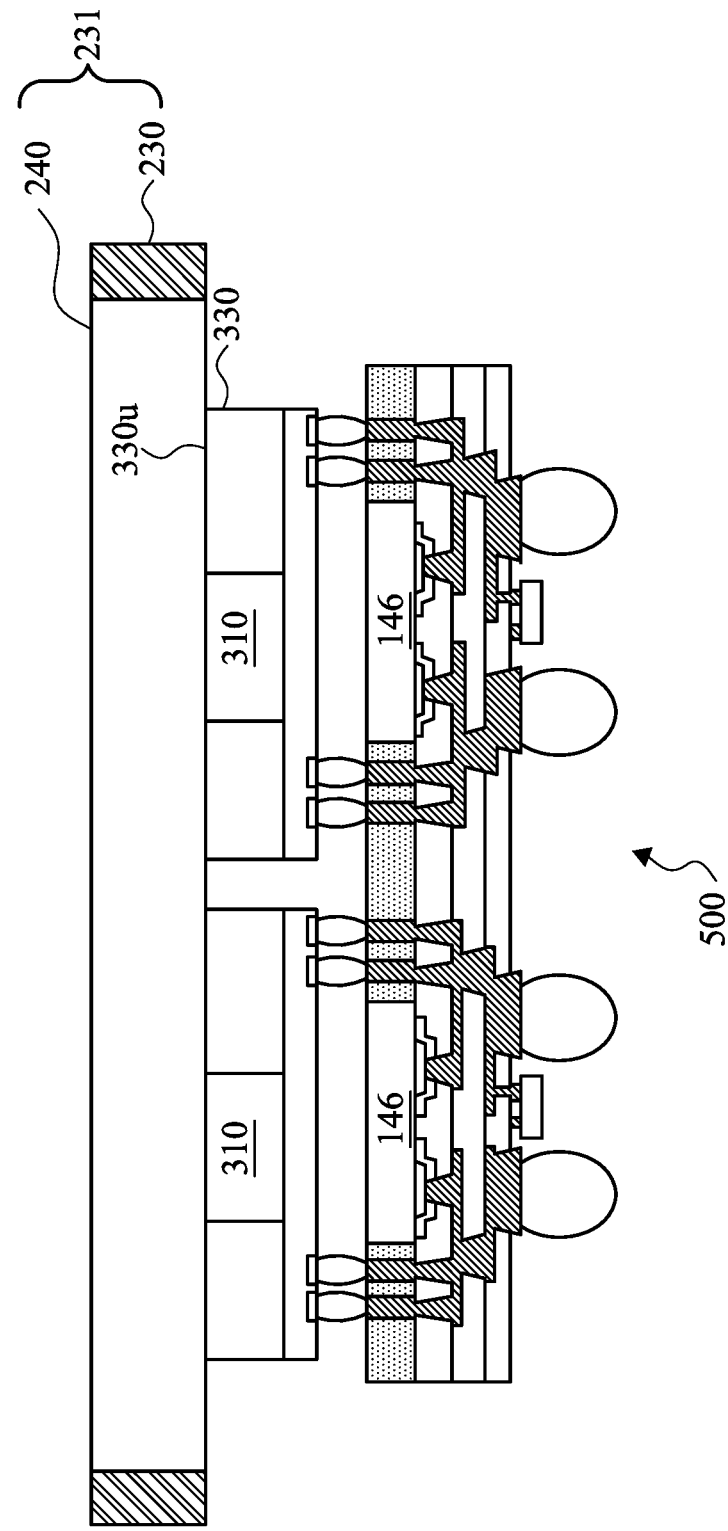

Next, referring to FIG. 7, semiconductor structure 500 is attached to a tape 240 supported by a frame 230, and thereafter, tape 220 and frame 210 (see FIG. 6) are removed from semiconductor structure 500. In some embodiments, top surfaces 330U of top packages 330 are attached to tape 240. Tape 240 may be a dicing tape, although other suitable tape may also be used. Tape 240 and frame 230 are sometimes referred to support 231.

Figure 8:
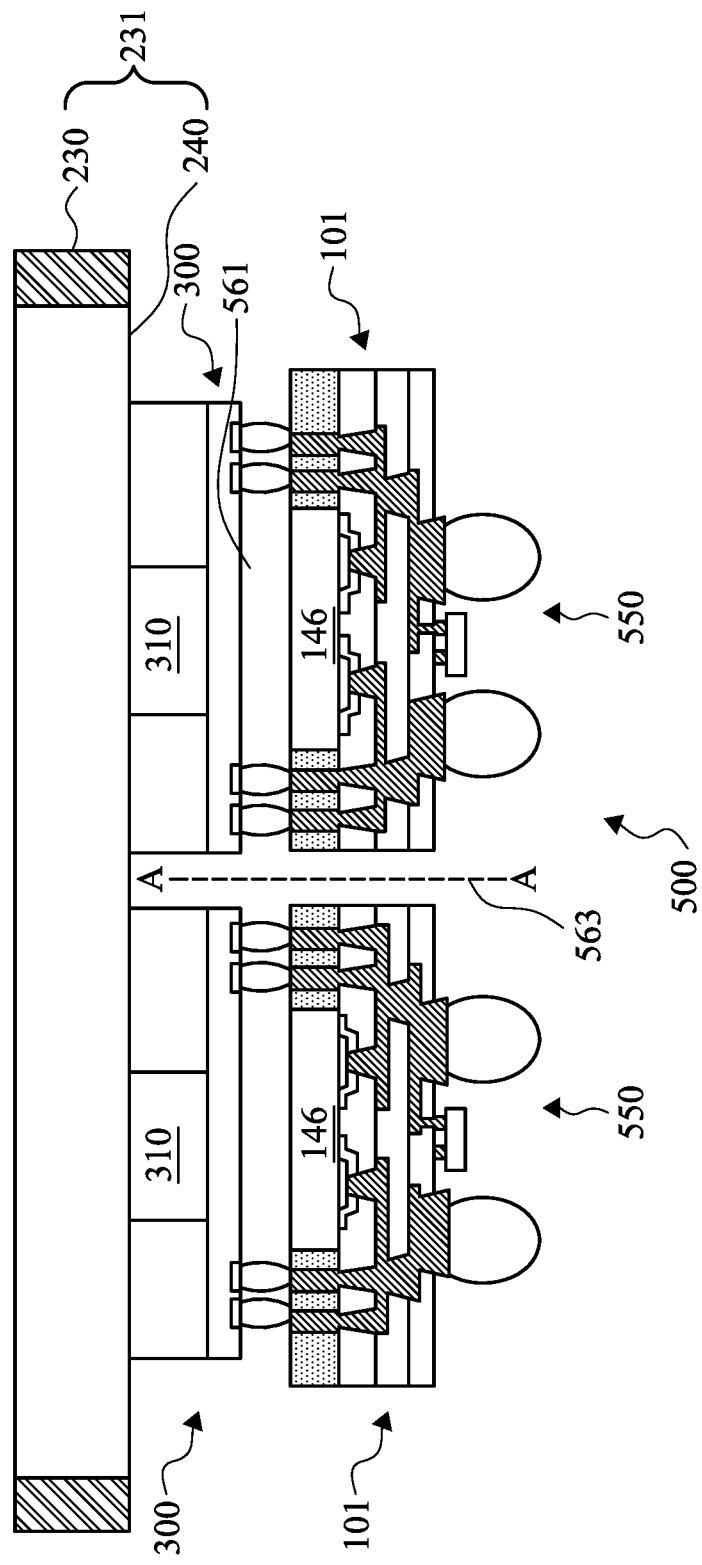

Referring to FIG. 8, semiconductor structure 500 are diced along line A-A using, e.g., dicing saw or laser, thereby forming a plurality of PoP packages 550. Each PoP package 550 includes a top package 300 coupled to a bottom package 101. The dicing separates bottom packages 101 without cutting top packages 300 or support 231, in some embodiments. Openings 563, or gaps 563, are formed between bottom packages 101, which gaps 563 facilitate the flow of a molded underfill material into gaps 561 between top packages 300 and bottom packages 101 in a subsequent molding process, in various embodiments.

Figure 9:
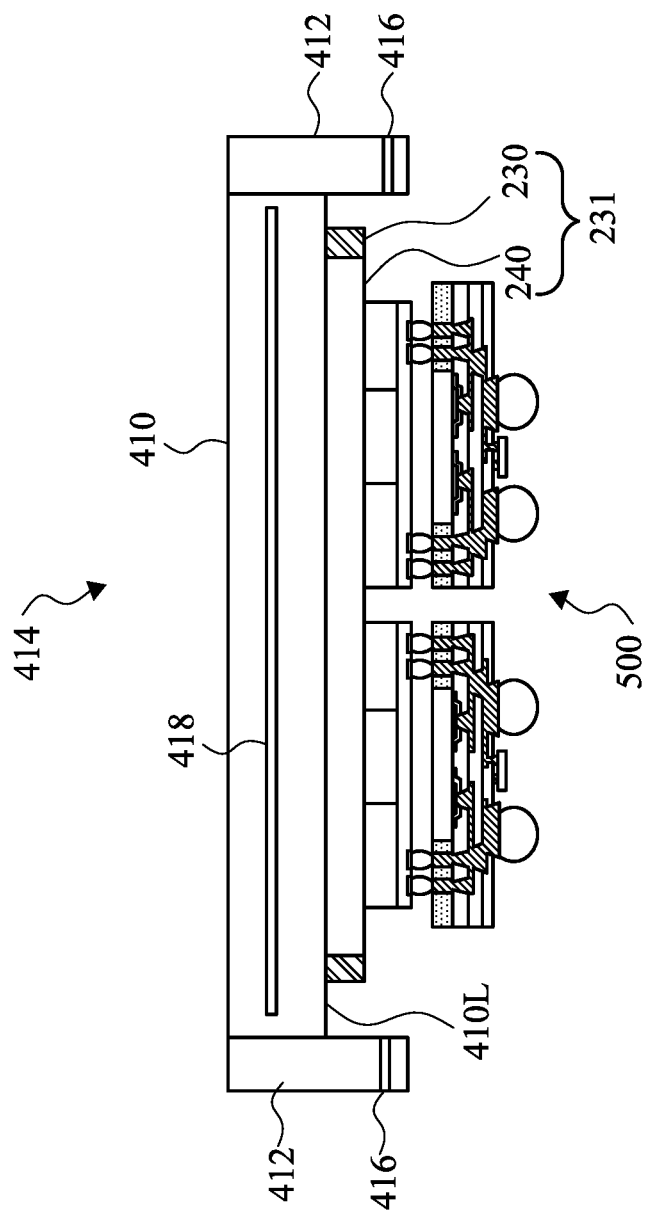

FIGS. 9-12 illustrate a molding process performed on semiconductor structure 500 in accordance with some embodiments. Referring to FIG. 9, semiconductor structure 500 is attached to an upper mold chase 414 via support 231. A first side of support 231 is attached to a center portion 410 of upper mold chase 414 by, e.g., a suction force exerted by a vacuum mechanism (not shown) in center portion 410, and semiconductor structure 500 is attached to a second side of support 231 opposing the first side, in some embodiments. As shown in FIG. 9, upper mold chase 414 includes a center portion 410 and sidewall portions 412 (also referred to as sidewalls 412). Center portion 410 may move up and down along sidewalls 412 (see FIG. 12), such that a distance between center portion 410 of upper mold chase 414 and a lower mold chase 424 (see FIG. 12) can be adjusted. Sidewalls 412 may have a vacuum mechanism 416 (e.g., conduits and valves) for creating a vacuum inside an enclosed cavity formed between upper mold chase 414 and lower mold chase 424, after upper mold chase 414 and lower mold chase 424 are closed to form the enclosed cavity. As shown in FIG. 9, upper mold chase 414 has a heating mechanism 418, which may be an electrical heating mechanism, or any other suitable heating mechanism. Heating mechanism 418 may be used to heat upper mold chase 414. As another example, heating sources outside upper mold chase 414, such as an infrared (IR) radiation source (not shown) may be used, in which case at least a portion of upper mold chase 414 and/or lower mold chase 424 should be IR-transparent (e.g., transparent to infrared radiation).

FIG. 10A illustrates a liquid molded underfill material (MUF) 430 being deposited into lower mold chase 424. Lower mold chase 424 may comprise a center portion 420 and sidewall portions 422 (also referred to as sidewall 422). Sidewalls 422 of lower mold chase 424 extend above (e.g., higher) than center portions 420 of lower mold chase 424, therefore, lower mold chase 424 has a U-shaped cross-section, in various embodiments. As illustrated in FIG. 10A, a release film 426 lines the inside of lower mold chase 424, and extends outside of lower mold chase 424. Release film 426 is formed of a relatively soft material, so that when external connectors 180, e.g., solder balls, are pressed into release film 426 (see FIG. 12), the solder balls are not damaged, and the solder balls may substantially maintain their shapes. For example, release film 426 may be a fluorine-base film, a silicon-coated polyethylene terephthalate film, a polymethylpentene film, a polypropylene film, or the like. Release film 426 may be dispensed from a roll (not shown), and a new segment of release film 426 may be dispensed for each semiconductor structure 500 processed, in some embodiments.

As shown in FIG. 10A, MUF 430 is deposited by a dispenser 432 into lower mold chase 424 and over release film 426, in some embodiments. Lower mold chase 424 may have a heating mechanism 428. Details of heating mechanism 428 may be similar to heating mechanism 418 of upper mold chase, thus are not repeated here. FIG. 10B illustrates a granular molded underfill material (MUF) 430 being deposited into lower mold chase 424 by a dispenser 432, with a release film 426 disposed between MUF 430 and lower mold chase 424. Liquid MUF or granular MUF from various manufacturers, such as Panasonic, Sumitomo, or Hitachi may be used as MUF 430.

Figure 11:
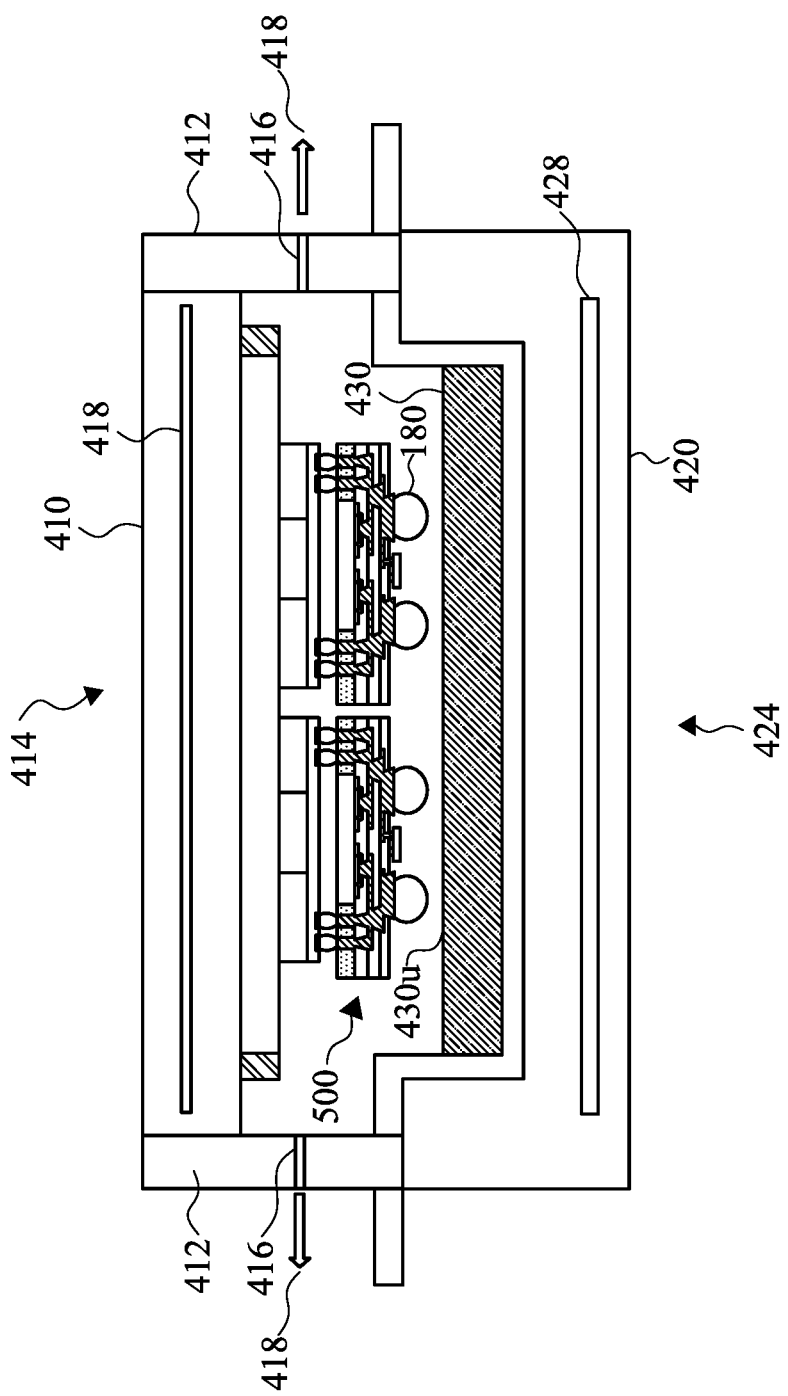

Referring now to FIG. 11, upper mold chase 414 and lower mold chase 424 are closed to form an enclosed cavity. Semiconductor structure 500 is attached to upper mold chase 414 and contained within the enclosed cavity. Next, upper mold chase 414 and lower mold chase 424 are heated to a desired temperature, e.g., between about 100° C. and about 200° C., using the built-in heating mechanism 418 and 428, which in turn heats MUF 430 to the desired temperature through conduction, in some embodiments. As another example, an outside IR radiation source (not shown) may be used with IR-transparent upper mold chase 414 and/or IR-transparent lower mold chase 424, such that IR energy is absorbed by MUF 430 and heats MUF 430 to a desired temperature, e.g., between about 100° C. and about 200° C. In cases where granular MUF 430 is deposited (see FIG. 10B), granular MUF 430 melts into a liquid form molding material due to the heating described above. Regardless of the form (e.g., granular or liquid) of the originally deposited MUF 430, after the heating process, MUF 430 is a liquid molding material at a desired temperature (e.g., between about 100° C. and about 200° C.), in various embodiments. Since a liquid molding material may have improved flowability at a higher temperature, the heating process may help the formation of molding compound in/around semiconductor structure 500 in subsequent processing, as discussed in more details below.

In some embodiments, the heating process may be started after upper mold chase 414 and lower mold chase 424 close to form an enclosed cavity. In other embodiments, the heating process may be started before upper mold chase 414 and lower mold chase 424 are closed. For example, before upper mold chase 414 and lower mold chase 424 are closed, heating mechanism 428 may be activated to heat lower mold chase 424 before, during, or after MUF 430 is deposited into lower mold chase 424. Starting heating lower mold chase 424 early (e.g., before MUF 430 is deposited) may advantageously reduce the time needed to melt MUF 430 into liquid form, thus reducing the overall processing time. As shown in FIG. 11, semiconductor structure 500 is above, thus does not contact, MUF 430 at this stage of processing. For example, external connectors 180 of semiconductor structure 500 are above an upper surface 430U of melted MUF 430.

After an enclosed cavity is formed by closing upper mold case 414 and lower mold chase 424, air is removed from the enclose cavity via vacuum mechanism 416, as indicated by arrow 418 in FIG. 11. In some embodiments, a vacuum of less than about 1 Torr is achieved in the enclosed cavity. The vacuum may advantageously help MUF 430 to flow into small gaps (e.g., gaps 561 in FIG. 8) between top packages and bottom packages of semiconductor structure 500 in subsequent processing. The removal of air from the enclosed cavity may be performed while MUF 430 is being heated by, e.g., heating mechanism 418 and 428.

Figure 12:
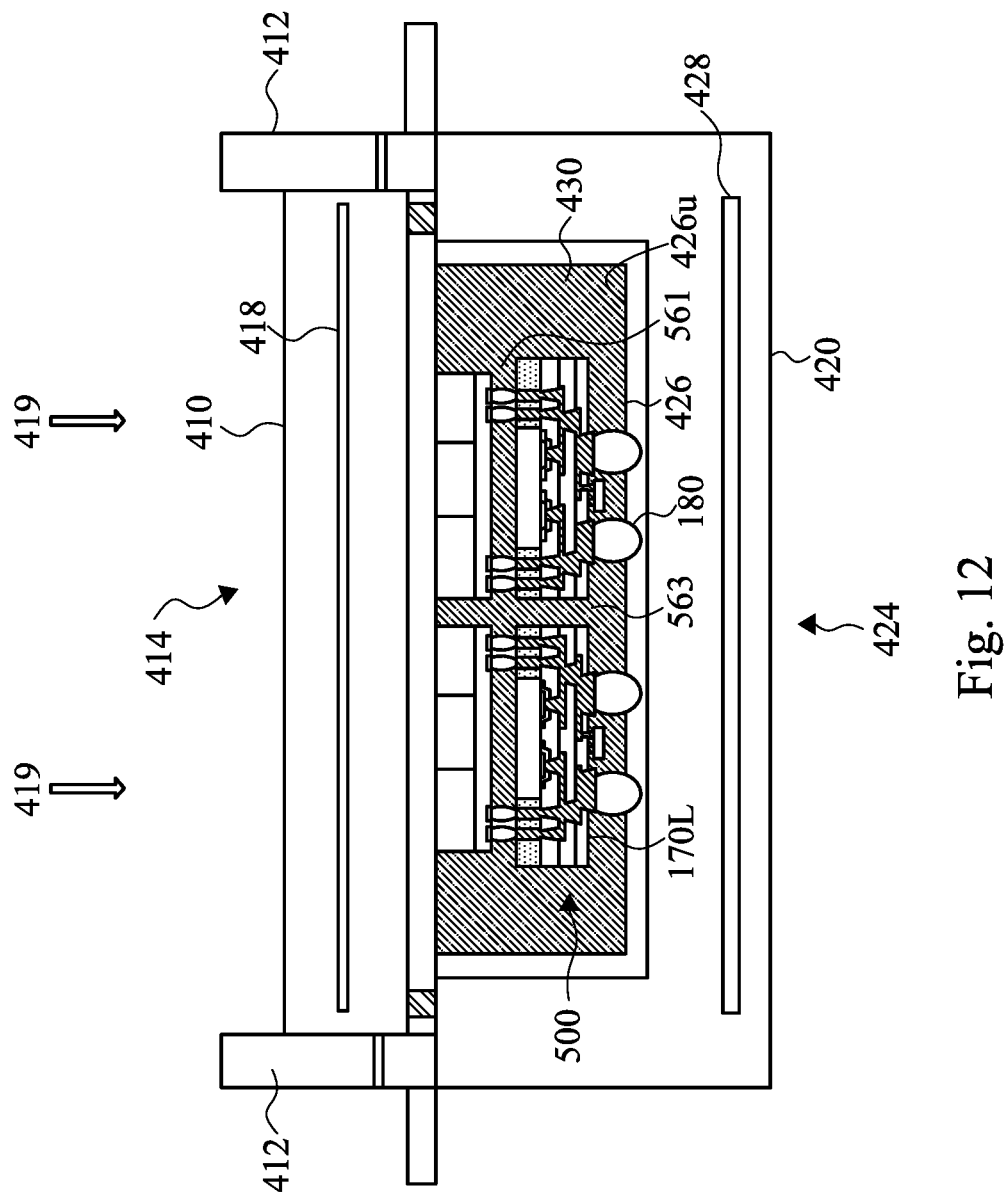

Referring to FIG. 12, after a desired level of vacuum (e.g., less than 1 Torr) is achieved in the enclosed cavity, semiconductor structure 500 is lowered toward lower mold chase 424, as indicated by arrows 419 in FIG. 12. The lowering of semiconductor structure 500 is achieved by moving center portion 410 of upper mold chase 414 along sidewalls 412 toward lower mold chase 424, in some embodiments. The upper mold chase 414 is designed to allow movement of center portion 410 along sidewalls 412 without breaking the vacuum, in various embodiments. In some embodiments, semiconductor structure 500 is immersed in MUF 430 when center portion 410 of upper mold chase 414 reaches a pre-determined stop position. The pre-determined stop position is chosen such that lower portions (e.g., portions facing away from semiconductor structure 500) of external connectors 180 are pressed into release film 426, as shown in FIG. 12. As discussed earlier, release film 426 is soft, so that external connectors 180 can be pressed into release film 426 without being damaged. Release film 426 also has a thickness large enough to accommodate at least the lower portions of external connectors 180, as shown in FIG. 12. The upper portion of external connectors 180 are above, thus not pressed into, release film 462. For example, there is a gap between a lower surface 170L of semiconductor structure 500 and an upper surface 426U of release film 426.

Still referring to FIG. 12, as center portion 410 of upper mold chase 414 approaches the pre-determined stop position, the compression between upper mold chase 414 and lower mold chase 424 forces MUF 430 to flow into and fills gaps of semiconductor structure 500. For example, MUF 430 flows into and fills gaps 561 between top packages and bottom packages of semiconductor device 500 and gaps 563. Besides the compression force, the vacuum (e.g., less than 1 Torr) also helps MUF 430 to flow into small gaps such as gaps 561. Therefore, underfill may be formed in gaps 561 between top packages and bottom packages of semiconductor device 500 without voids (e.g., empty spaces), which improves the reliability and the yields of PoP packages.

As discussed above, the molding process illustrated in FIGS. 9-12, using factors such as the compressive force and the vacuum, enables MUF 430 to easily flow into and fill gaps 561 between top packages and bottom packages of semiconductor structure 500. Therefore, the requirements on the flowability of the molding material is more relaxed compared with that of conventional methods which may rely on capillary action alone to fill gaps 561. This allows a wide selection of MUF materials, and/or a mixture of different MUF materials, to be used as MUF 430. As a result, the CTE of MUF 430 can be selected in a wide range. For example, a CET range of 3 parts per million per degree (ppm/C°) to 60 ppm/C° can be achieved by MUF 430. By properly adjusting the CTE of MUF 430, warpage of PoP packages 550 (see FIG. 14A) can be reduced or prevented. Mechanical stress of inter-package connectors 350 (see FIG. 6) may also be reduced. For example, by adjusting the CTE of MUF 430 to be the same as or close to the CTE of a material of the PoP package (e.g., silicon), warpage of PoP packages may be reduced. As another example, if the overall CTEs of the top package and the bottom package have a large mismatch, the CTE of MUF 430 may be chosen to have a value between the overall CTEs of the top package and the bottom package, this may help to reduce warpage of the PoP package and the mechanical stress experienced by inter-package connectors 350. As discussed above, better package warpage control is achieved by adjusting the CTE of MUF 430 within a wide range, which wide range is afforded by the embodiment method. This illustrates an advantage of the current disclosure.

Still referring to FIG. 12, curing is performed after center portion 410 of upper mold chase 414 reaches the pre-determined stop position and MUF 430 fills gaps of semiconductor structure 500. Curing is performed at a temperature similar to or same as the heating temperature, e.g., about 100° C. to about 200° C., in some embodiments. The same heating mechanism used for the heating process, e.g., heating mechanism 418/428, may be used for curing, although other suitable heating mechanism and/or sources may also be used. In an embodiment of the present disclosure, curing is performed at a temperature from about 100° C. to about 200° C. for a duration of about 3 minutes to about 10 minutes.

Figure 13:
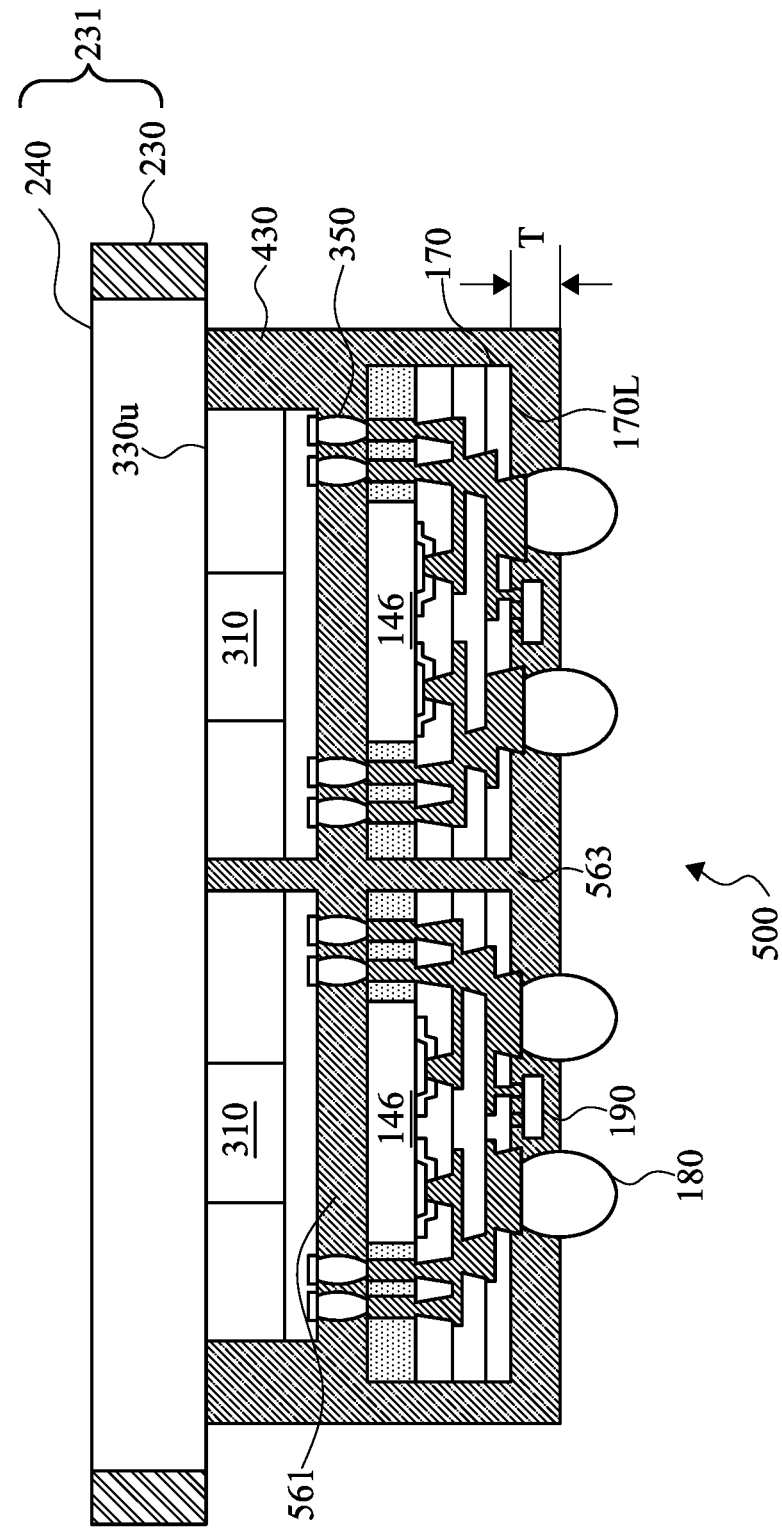

Referring now to FIG. 13, after curing, semiconductor structure 500 and support 231 are removed from upper mold chase 414. In some embodiments, upper mold chase 414 and lower mold chase 424 are opened for removal of semiconductor structure 500 and support 231 while still at substantially the same temperature as the curing temperature. In other embodiments, upper mold chase 414 and lower mold chase 424 remain closed after curing, and a cooling process is performed before upper mold chase 414 and lower mold chase 424 are opened for removal of semiconductor structure 500 and support 231. The cooling process may lower the temperature of the semiconductor structure 500 and support 231 to a temperature lower than the curing temperature, e.g., a room temperature. Any suitable cooling method, such as air cooling, water cooling, combinations thereof, may be used.

As shown in FIG. 13, cured MUF 430 are formed around semiconductor structure 500 and fills the gaps (e.g., gaps 561 and gaps 563) of semiconductor structure 500. Underfill is formed in gaps 561 between top packages and bottom packages of semiconductor structure 500 without voids. Compared with the conventional method of forming underfill, which uses dispending needles to dispense underfill material next to gaps 561 and relies on capillary action to fill gaps 561 with underfill material, the currently disclosed method can significantly improve the process time for forming underfill. For example, the wafer per hour (WPH) count for the disclosed molding process can be five times of the WPH of conventional capillary action based molding methods. In addition, cured MUF 430 covers RDLs (e.g., RDL 170) of semiconductor structure 500, this eliminates the need for one or more passivation layer(s) over RDL 170, thus significantly reducing material cost and processing time. As illustrated in FIG. 13, cured MUF 430 is formed over lower surface 170L of semiconductor structure 500 and encapsulates IPD devices 190, thus protecting IPD devices 190 from adverse elements of ambient environment such as moisture and impact. Cured MUF 430 also surrounds upper portions (e.g., portions close to surface 170L) of external connectors 180, therefore supports and reinforces external connectors 180. In some embodiments, a thickness T of the cured MUF 430 over surface 170L of semiconductor device 500 is between about 30 μm to about 70 μm, such as between about 10 μm to about 20 μm.

Still referring to FIG. 13, top surfaces 330U of semiconductor structure 500 were attached to tape 240 during the molding process, and thus is substantially free of cured MUF 430. This avoids the problem of molding material contaminating (e.g., getting on) top surfaces 330U of semiconductor structure 500. Lower portions of external connectors 180 were embedded (e.g., pressed into) release film 426 during the molding process, and therefore, is also substantially free of cured MUF 430. This allows external connectors 180 to be ready for electrical connection after the molding process without the need for an additional cleaning process to clear external connectors 180, which saves manufacturing cost and reduces processing time.

Figure 14A:
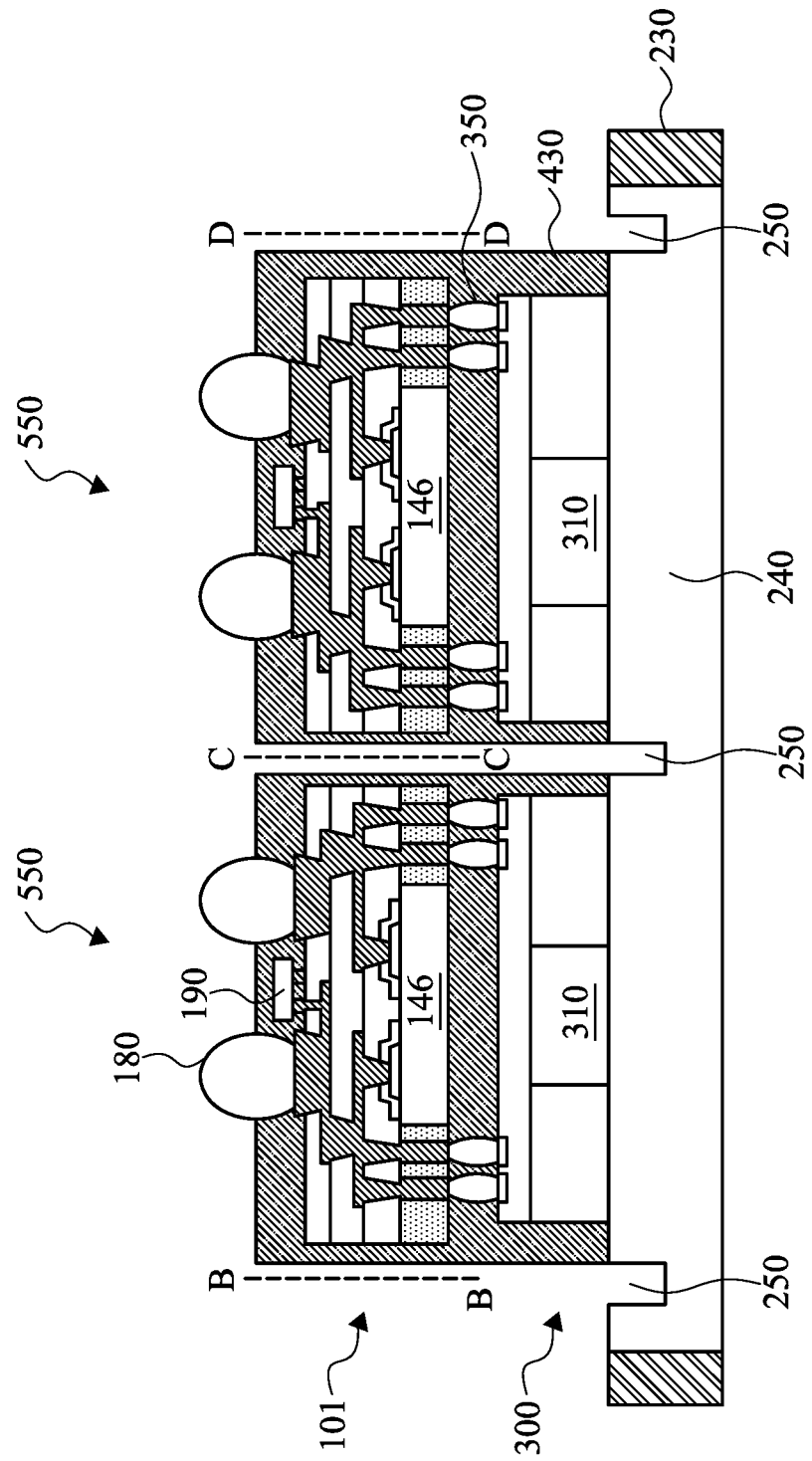

Next, referring to FIG. 14A, semiconductor structure 500 shown in FIG. 13 is flipped over, and dicing is performed to form a plurality of individual PoP packages 550. In some embodiments, dicing starts from bottom packages 101 and goes toward top packages 300 along lines B-B, C-C, and D-D illustrated in FIG. 14A. Dicing saw or laser, or both, may be used for dicing. The depth of dicing is controlled to singulate PoP packages 550 without cutting tape 240 into separate pieces, in some embodiments. For example, recesses 250 are formed in tape 240 by the dicing process without cutting through tape 240. After dicing, a plurality of PoP packages 550 are formed. PoP packages 550 may be picked up and put into trays for, e.g., further testing and assembling.

In FIG. 14A, cured MUF 430 covers sidewalls of top package 330 and sidewalls of bottom package 101 of each PoP package 550. For example, for the PoP package 550 illustrated on the left side of FIG. 14A, sidewalls of bottom package 101 and sidewalls of top package 300 (e.g., sidewalls next to lines B-B and C-C) have cured MUF 430 thereon. FIGS. 14B-14F illustrates other examples of PoP packages 550 formed after dicing. The locations of cured MUF 430 on PoP packages 550 after dicing, as shown in FIGS. 14A-14F, may be determined by factors such as the width of recess 250, the sizes of bottom package 300 and top package 101, and how bottom packages 300 and top packages 101 are aligned to form PoP packages 550.

Figure 14B:
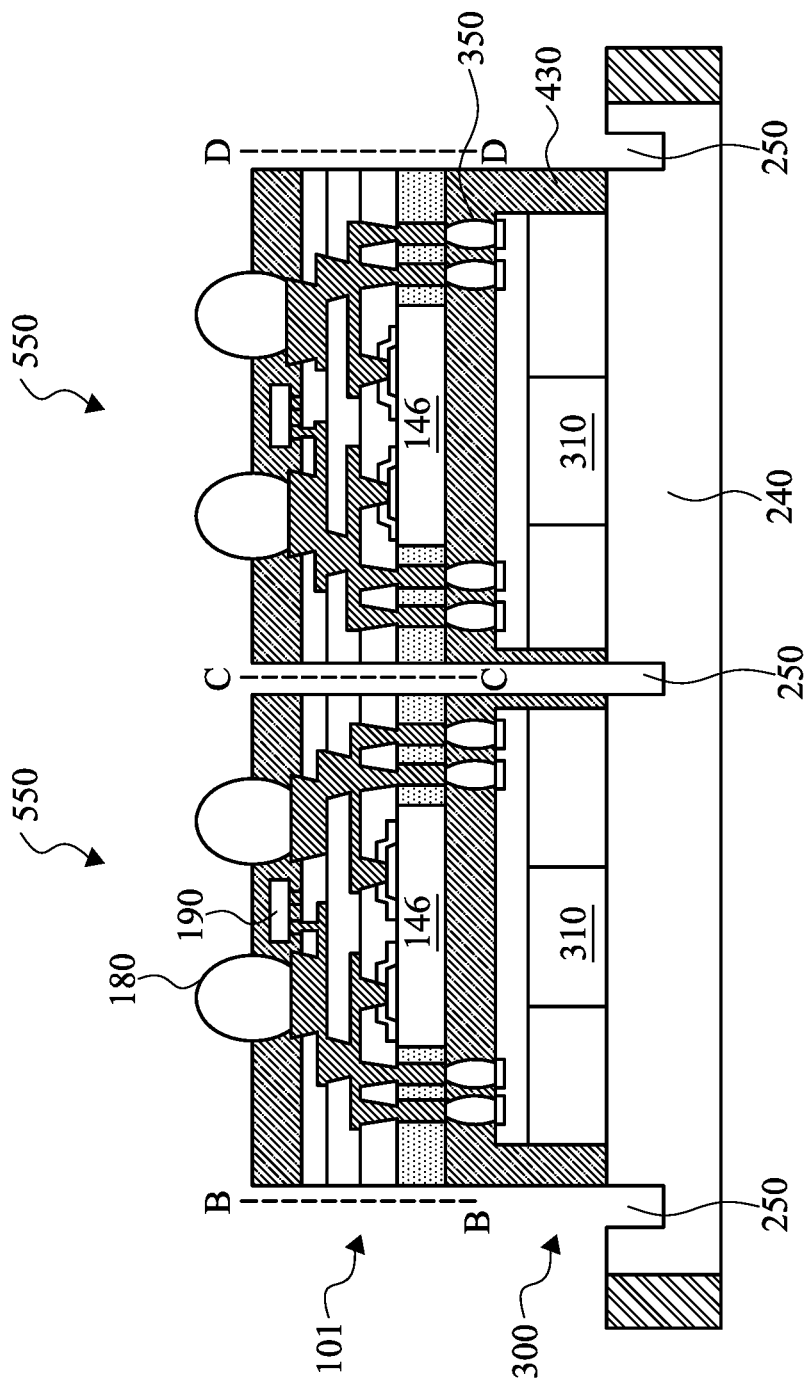
Figure 14C:
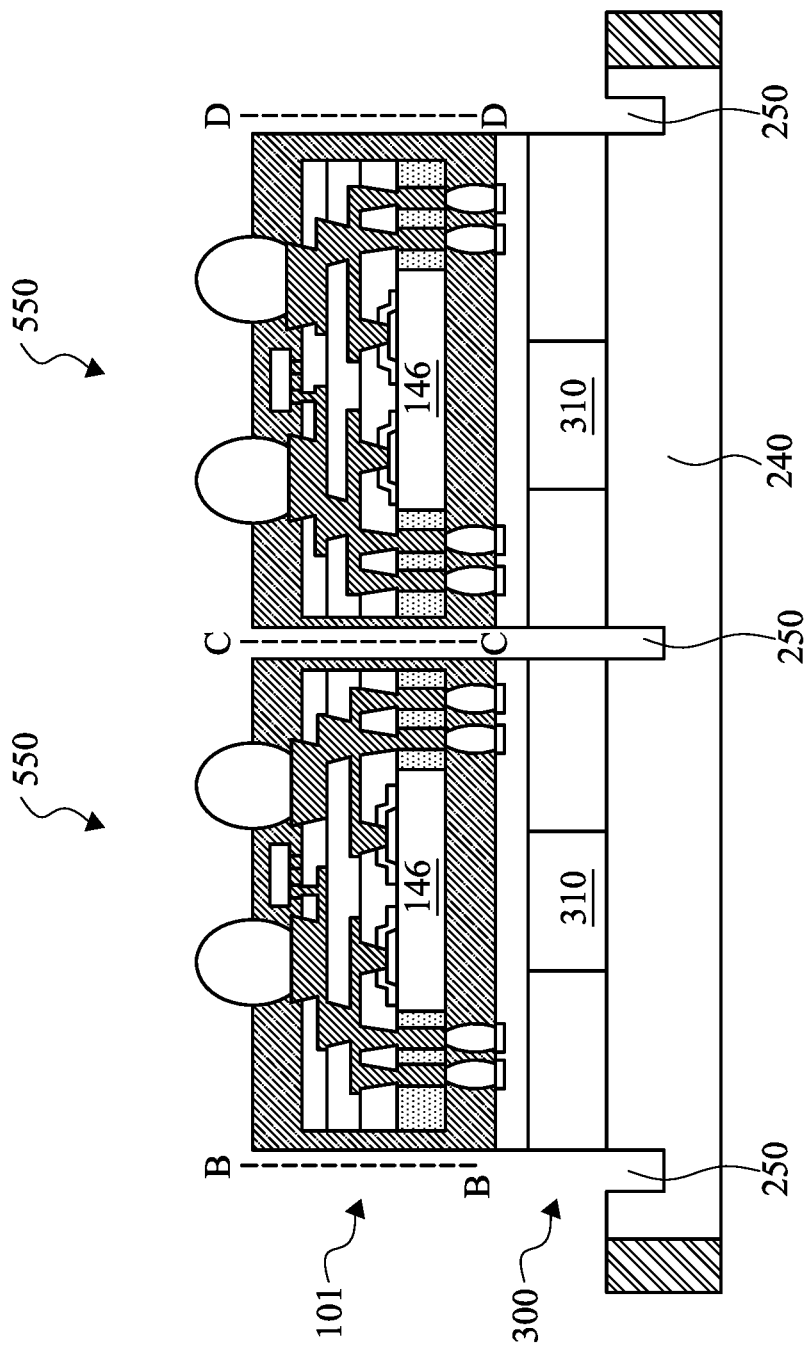
Figure 14D:
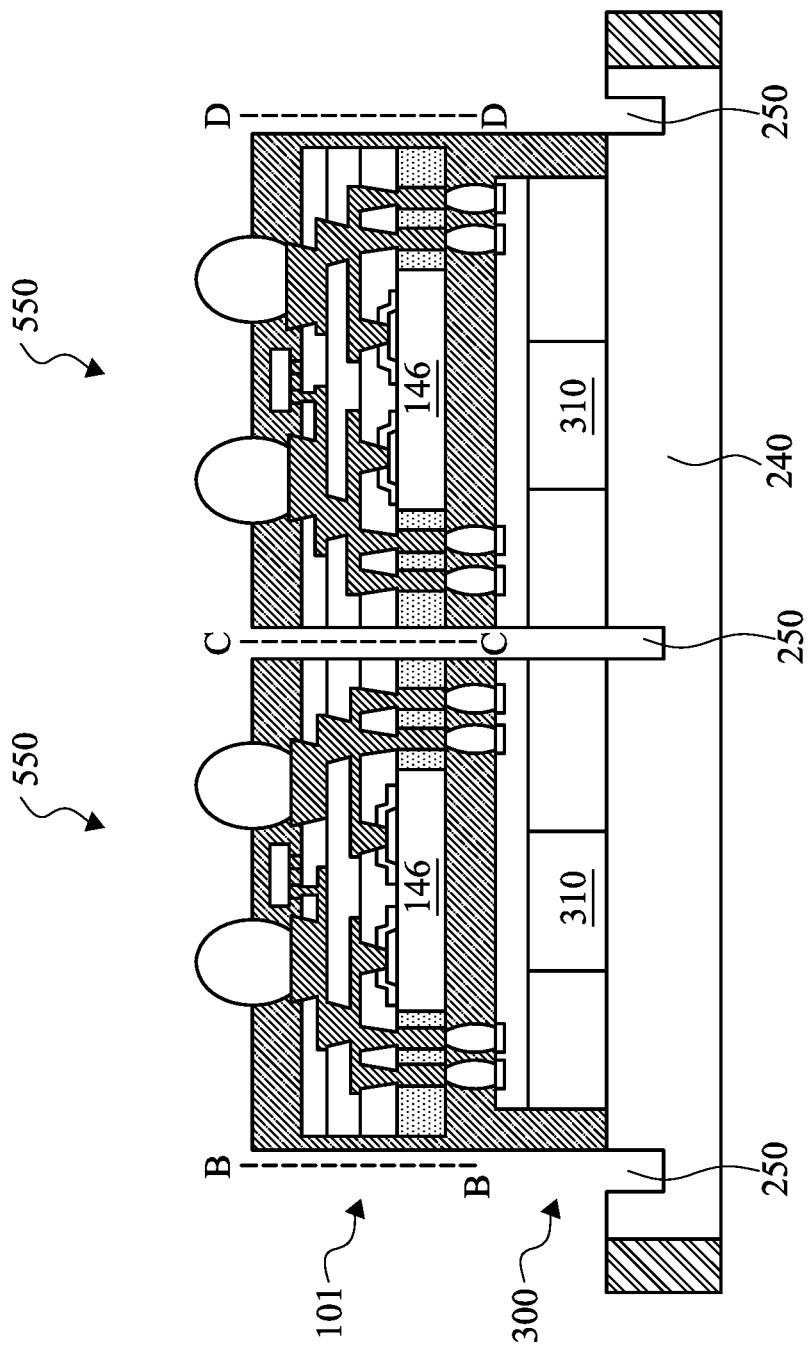
Figure 14E:
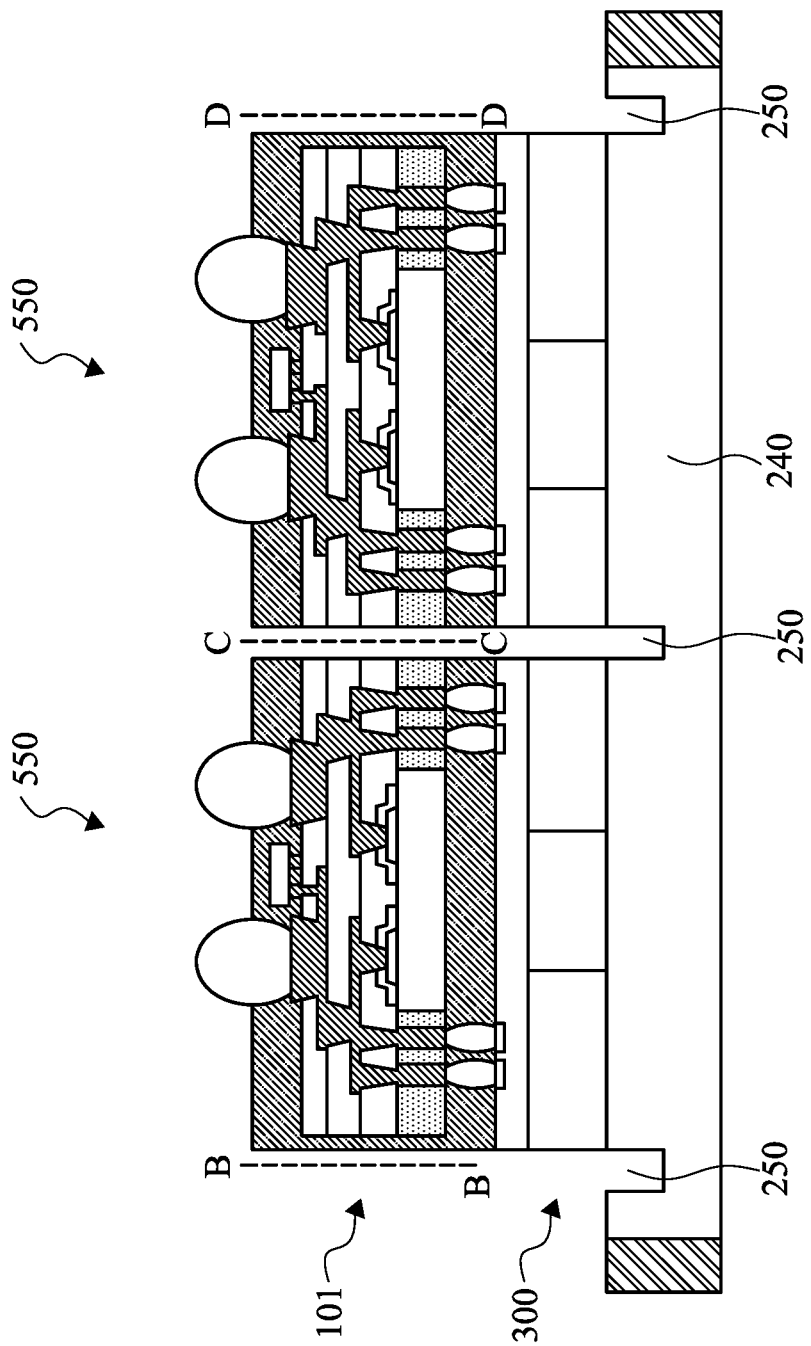
Figure 14F:
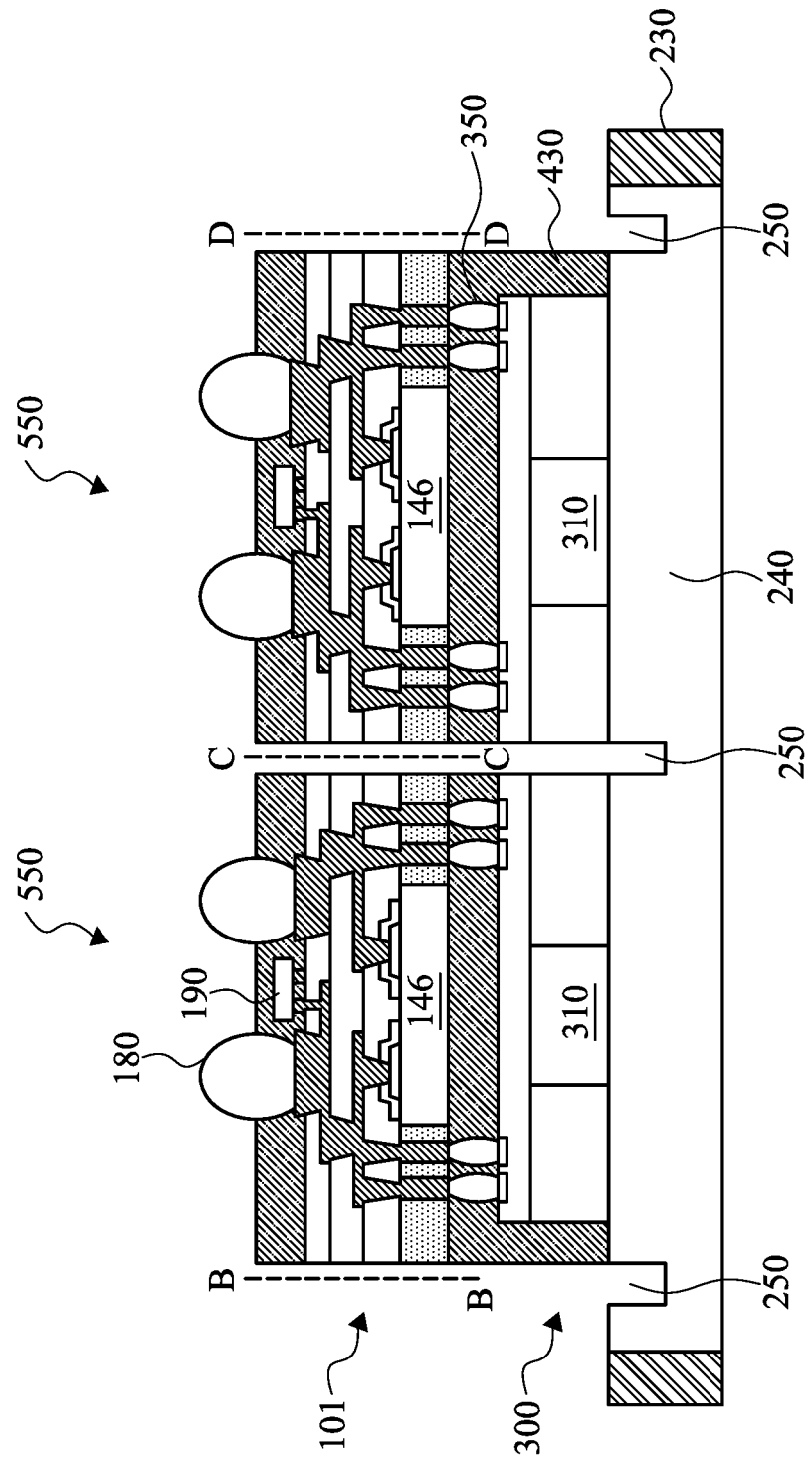

FIGS. 14B and 14C illustrate two examples where for each PoP package 550, the sidewalls of one of top package 300 and bottom package 101 are covered by cured MUF 430, while the sidewalls of the other one of top package 300 and bottom package 101 are substantially free of (e.g., not covered by) cured MUF 430. FIG. 14D illustrates another example where for each PoP package 550, a first sidewall (e.g., the sidewall adjacent to line C-C) of top package 300 and a first sidewall (e.g., the sidewall adjacent to line C-C) of bottom packages 101 align vertically along the direction of line C-C and are substantially free of (e.g., not covered by) cured MUF 430, whereas a second sidewall of top package 300 (e.g., the sidewall adjacent to line B-B or D-D) and a second sidewall of bottom package 101 (e.g., the sidewall adjacent to line B-B or D-D) are covered by cured MUF 430. FIGS. 14E and 14F further illustrate two more examples that are similar to FIG. 14D, except that for each PoP package 550, one of the second sidewalls of the top and the bottom packages is substantially free of (e.g., not covered by) cured MUF 430. One skilled in the art will appreciate that other variations are possible, and are within the scope of the present disclosure.

FIG. 15 illustrates a flow chart of a method of forming a semiconductor package, in accordance with some embodiments. It should be understood that the embodiment methods shown in FIG. 15 is an example of many possible embodiment methods. One of ordinary skill in the art would recognize many variations, alternatives, and modifications. For example, various steps as illustrated in FIG. 15 may be added, removed, replaced, rearranged and repeated.

Referring to FIG. 15, at step 1010, a semiconductor structure including a plurality of top packages coupled to corresponding ones of a plurality of bottom packages is provided. At step 1020, the semiconductor structure is attached to an upper mold chase. At step 1030, the upper mold chase and a lower mold chase are closed, thereby forming an enclosed cavity. At step 1040, air is removed from the enclosed cavity. At step 1050, the semiconductor structure is immersed in a molded underfill (MUF) material contained in the enclosed cavity after the removing the air. At step 1060, the MUF material is cured.

Embodiments of the above described processes for forming semiconductor packages may have many advantages. For example, the wafer per hour (WPH) count is significantly improved due to the molding process disclosed, thereby improving efficiency and reducing production cost. As another example, a wide selection of MUF materials and a wide range of CTE coefficients for the MUF are available due to, e.g., relaxed requirements on the flowablility of the molding material. This allows less expensive MUF materials to be used in the molding process, thus reducing material cost. The wide range of CTEs allows the MUF to be chosen to reduce or prevent warpage of the PoP packages, thus achieving better warpage control. The cured MUF covers and protects IPD devices, and offers support and protection for external connectors (e.g., BGA balls or solder balls) of the PoP packages.

In accordance with an embodiment of the present disclosure, a method of forming semiconductor packages includes providing a semiconductor structure including a plurality of top packages coupled to corresponding ones of a plurality of bottom packages, attaching the semiconductor structure to an upper mold chase, and closing the upper mold chase and a lower mold chase, thereby forming an enclosed cavity. The method also includes removing air from the enclosed cavity, immersing the semiconductor structure in a molded underfill (MUF) material contained in the enclosed cavity, and curing the MUF material.

In other embodiments, a package-on-package (PoP) structure includes a first semiconductor package having a first side and a second side opposing the first side, a second semiconductor package having a first side and a second side opposing the first side, and a plurality of inter-package connector coupled between the first side of the first semiconductor package and the first side of the second semiconductor package. The PoP structure further includes a first molding material on the second side of the first semiconductor package. The second side of the second semiconductor package is substantially free of the first molding material.

In yet other embodiments, a semiconductor package includes a top package comprising a first die disposed over a substrate, and a bottom package coupled to the top package at a first side of the bottom package via a plurality of inter-package connectors. The bottom package includes a second die at the first side of the bottom package, a redistribution layer (RDL) over the second die, and a plurality of external connectors over the RDL. The semiconductor package further includes a first molding material that is disposed on an upper surface of the RDL facing away from the top package, and disposed on at least one of a first sidewall of the RDL and a first sidewall of the substrate.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming semiconductor packages comprising:
    providing a semiconductor structure comprising a plurality of top packages coupled to corresponding ones of a plurality of bottom packages;
    attaching the semiconductor structure to an upper mold chase;
    closing the upper mold chase and a lower mold chase, thereby forming an enclosed cavity;
    removing air from the enclosed cavity;
    immersing the semiconductor structure in a molded underfill (MUF) material contained in the enclosed cavity, wherein sidewalls of the plurality of top packages and sidewalls of the plurality of bottom packages are covered by the MUF material after the immersing, wherein a coefficient of thermal expansion (CTE) of the MUF material is chosen to be between a first overall CTE of the plurality of top packages and a second overall CTE of the plurality of bottom packages; and
    curing the MUF material.

2. The method of claim 1, further comprising depositing the MUF material in the lower mold chase before the closing.

3. The method of claim 2, further comprising heating the MUF material before the immersing.

4. The method of claim 3, wherein the curing and the heating are performed at a same temperature while the upper mold chase and the lower mold chase are closed.

5. The method of claim 1, wherein the removing the air comprises removing air from the enclosed cavity to form a vacuum of less than about 1 Torr.

6. The method of claim 5, wherein the immersing comprises moving the semiconductor structure toward the lower mold chase such that the semiconductor structure is submerged in the MUF material, wherein the moving causes external connectors of the plurality of bottom packages to be partially embedded in a release film disposed between the MUF material and the lower mold chase, with a gap between the semiconductor structure and the release film.

7. The method of claim 1, wherein the curing forms a cured MUF material over the semiconductor structure, wherein the cured MUF material covers lower portions of external connectors of the plurality of bottom packages while exposing upper portions of the external connectors distal to the semiconductor structure.

8. The method of claim 7, wherein the cured MUF material further encapsulates a plurality of integrated passive devices (IPDs) disposed between the external connectors of the plurality of bottom packages.

9. A method of forming a semiconductor device comprising:
- bonding a first side of a first semiconductor package to a first side of a second semiconductor package;
- attaching a second side of the first semiconductor package to a first support, the second side of the first semiconductor package opposing the first side of the first semiconductor package;
- attaching the first support to a center portion of an upper mold chase;
- depositing a molded underfill material in a lower mold chase, wherein a coefficient of thermal expansion (CTE) of the molded underfill material is between a first overall CTE of the first semiconductor package and a second overall CTE of the second semiconductor package;
- closing the upper mold chase and the lower mold chase to form an enclosed cavity;
- removing air from the enclosed cavity to form a vacuum in the enclosed cavity;
- moving the center portion of the upper mold chase along sidewall portions of the upper mold chase toward the lower mold chase after removing the air such that the first semiconductor package and the second semiconductor package are immersed in the molded underfill material, wherein during moving the center portion of the upper mold chase, sidewalls of the center portion of the upper mold chase physically contact and move along respective sidewalls of the sidewall portion of the upper mold chase; and
- curing the molded underfill material while the upper mold chase and the lower mold chase are closed.

10. The method of claim 9, further comprising heating the molded underfill material before lowering the center portion of the upper mold chase.

11. The method of claim 10, wherein the molded underfill material is heated to a temperature between about 100° C. and about 200° C.

12. The method of claim 10, wherein the heating and the curing are performed at a same temperature.

13. The method of claim 9, further comprising lining an interior of the lower mold chase with a release film before depositing the molded underfill material in the lower mold chase.

14. The method of claim 13, wherein the second semiconductor package has external connectors on a second side of the second semiconductor package opposing the first side of the second semiconductor package, wherein the method further comprises:
- stopping moving the center portion of the upper mold chase when lower portions of the external connectors are pressed into the release film, wherein after the stopping, upper portions of the external connectors are outside the release film.

15. The method of claim 9, wherein moving the center portion of the upper mold chase is performed without breaking the vacuum.

16. A method of forming a semiconductor package comprising:
- attaching a semiconductor structure to a center portion of an upper mold chase, the semiconductor structure comprising a first semiconductor package bonded to a second semiconductor package, the center portion of the upper mold chase being movable along sidewalls of the upper mold chase;
- lining an interior of a lower mold chase with a release film;
- depositing a molded underfill material in the lower mold chase over the release film, wherein a coefficient of thermal expansion (CTE) of the molded underfill material is between a first overall CTE of the first semiconductor package and a second overall CTE of the second semiconductor package;
- heating the molded underfill material;
- closing the upper mold chase and the lower mold chase to form an enclosed cavity;
- removing air from the enclose cavity to form a vacuum;
- after removing the air, moving the center portion of the upper mold chase toward the lower mold chase such that the semiconductor structure is surrounded by the molded underfill material;
- stopping movement of the center portion of the upper mold chase when external connectors on a first side of the second semiconductor package are partially pressed into the release film; and
- curing the molded underfill material.

17. The method of claim 16, wherein the sidewalls of the upper mold chase has a vacuum mechanism, wherein removing the air is performed using the vacuum mechanism in the sidewalls of the upper mold chase.

18. The method of claim 16, wherein moving the center portion of the upper mold chase is performed without breaking the vacuum.

19. The method of claim 16, wherein the semiconductor structure comprises other semiconductor packages besides the first semiconductor package and the second semiconductor package, wherein the method further comprises:
- after the curing, removing the semiconductor structure from the upper mold chase; and
- performing a dicing process to separate the first semiconductor package and the second semiconductor package from the other semiconductor packages, wherein after the dicing process, the first side of the second semiconductor package is covered by the molded underfill material, first portions of the external connectors are embedded in the molded underfill material, and second portions of the external connectors are exposed by the molded underfill material.

20. The method of claim 19, wherein after the dicing, a sidewall of the first semiconductor package and a sidewall of the second semiconductor package are covered by the molded underfill material.

* * * * *